United States Patent
Sakai et al.

(10) Patent No.: US 7,693,194 B2
(45) Date of Patent: Apr. 6, 2010

(54) FUNDAMENTAL-WAVE LIGHT SOURCE AND WAVELENGTH CONVERTER

(75) Inventors: Kiyohide Sakai, Tokyo (JP); Yasuharu Koyata, Tokyo (JP); Masao Imaki, Tokyo (JP); Yoshihito Hirano, Tokyo (JP); Kouhei Teramoto, Tokyo (JP); Shigenori Shibue, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 11/597,360

(22) PCT Filed: Aug. 12, 2004

(86) PCT No.: PCT/JP2004/011613

§ 371 (c)(1),
(2), (4) Date: Nov. 21, 2006

(87) PCT Pub. No.: WO2006/016410

PCT Pub. Date: Feb. 16, 2006

(65) Prior Publication Data

US 2007/0230527 A1    Oct. 4, 2007

(51) Int. Cl.
*H01S 3/13* (2006.01)
(52) U.S. Cl. ................................ 372/29.022
(58) Field of Classification Search ............. 372/43.01, 372/29.022
See application file for complete search history.

(56) References Cited

U.S. PATENT DOCUMENTS

| 5,321,718 | A |   | 6/1994  | Waarts et al. |
|-----------|---|---|---------|---------------|
| 5,485,481 | A | * | 1/1996  | Ventrudo et al. ........... 372/6 |
| 5,544,271 | A | * | 8/1996  | Lim ......................... 385/122 |
| 5,555,544 | A | * | 9/1996  | Walpole et al. ............ 372/50.1 |
| 5,561,676 | A | * | 10/1996 | Goldberg ................... 372/18 |
| 5,745,284 | A |   | 4/1998  | Goldberg et al. |
| 5,838,702 | A | * | 11/1998 | Byer et al. .................. 372/21 |
| 6,525,872 | B1 | * | 2/2003 | Ziari et al. .............. 359/341.3 |
| 6,556,597 | B2 |   | 4/2003 | Hatta et al. |
| 6,687,010 | B1 | * | 2/2004 | Horii et al. ................ 356/479 |
| 2002/0061032 | A1 | * | 5/2002 | Miura et al. .................. 372/4 |
| 2005/0175046 | A1 | * | 8/2005 | Khazaei et al. .......... 372/29.02 |

FOREIGN PATENT DOCUMENTS

JP    5-249519 A    9/1993

(Continued)

OTHER PUBLICATIONS

Malcolm W. Wright et al., IEEE Photonics Technology Letters, vol. 10, No. 4, pp. 504-506, Apr. 1998.

(Continued)

*Primary Examiner*—Minsun Harvey
*Assistant Examiner*—Patrick Stafford
(74) *Attorney, Agent, or Firm*—Birch, Stewart, Kolasch & Birch, LLP

(57) ABSTRACT

A reflection element 3 disposed in an optical waveguide element 2 returns a part of light to a semiconductor laser diode element 1 so that the semiconductor laser diode element 1 oscillates in a coherent collapse mode, and a semiconductor light amplifier 7 is optically coupled to the optical waveguide element 2, and amplifies an optical output from optical waveguide element 2, so as to provide a high-power fundamental-wave light source.

15 Claims, 3 Drawing Sheets

FOREIGN PATENT DOCUMENTS

| | | |
|---|---|---|
| JP | 11-234246 | 8/1999 |
| JP | 11-509933 | 8/1999 |
| JP | 2002-296147 | 10/2002 |
| JP | 2003-512717 | 4/2003 |
| WO | WO 2004/025363 A1 | 3/2004 |

OTHER PUBLICATIONS

D. J. Bossert et al., IEEE Photonics Technology Letters, vol. 7, No. 5, pp. 470-472, May 1995.

Bandelow et al., IEEE Photonics Technology Letters, vol. 5, No. 10, pp. 1179-1182, Oct. 1993.

R. W. Tkach et al., Journal of Lightwave Technology, vol. LT-4, No. 11, pp. 1655-1661, Nov. 1986.

Martin M. Fejer et al., IEEE Journal of Quantum Electronics, vol. 28, No. 11, pp. 2631-2654, Nov. 1992.

Shinichiro Sonoda et al., Applied Physics Letters, vol. 71, No. 24, pp. 3048-3050, Nov. 1997.

\* cited by examiner

FUNDAMENTAL-WAVE LIGHT SOURCE AND WAVELENGTH CONVERTER

FIELD OF THE INVENTION

The present invention relates to a high-power fundamental-wave light source and a high-power wavelength converter which are used as a light source of a laser printer, a laser display device, an optical memory device, or the like.

BACKGROUND OF THE INVENTION

In recent years, a light source which emits rays of light of blue, green, and red which are three primary colors, each ray of light having an optical output of several watts, has been required with increase in the sizes of display devices. By the way, semiconductor laser diode elements which can emit a ray of blue or green light having a high power of several watts will not be able to be implemented in the near future. Therefore, the most realistic method of providing a ray of blue or green light having a high power of several watts is a method of performing wavelength changing on a high-power fundamental wave produced by a solid state laser device using a nonlinear optical crystal (referred to as a wavelength changing element from here on) having a periodic polarization reversing structure in a state of quasi phase matching. However, these days, because the cost of such a solid state laser device which emits light having a high power is very expensive, a wavelength converter which converts a fundamental wave produced by a semiconductor laser diode element directly into a second harmonic wave using a wavelength changing element is considered to be promising, and therefore research and development of a high-power fundamental-wave light source and a wavelength converter using this light source have been continued.

An example of prior art wavelength converters which uses a monolithic integrated MOPA (an abbreviation of Master Oscillator Power Amplifier) element as a fundamental-wave light source, and which generates a second harmonic wave of about 100 mW from a fundamental wave having an optical output of about 1 W using a wavelength changing element is disclosed. In this MOPA element, a master oscillator having a DBR (Distributed Bragg Reflector) structure which outputs light in a single transverse mode and light in a single longitudinal mode, and a flared semiconductor light amplifier which amplifies the light beams while maintaining their beam quality are integrated on the same semiconductor substrate. As applications of MOPA elements, a combination of a MOPA element and a wavelength changing element provided with a multimode optical waveguide and an example of structure in which a diffraction grating is placed on a rear face of a tapered semiconductor light amplifier are also disclosed (for example, refer to patent reference 1).

Furthermore, there has been disclosed a prior art wavelength converter including a master oscillator in which a resonator in which a diffraction grating is placed at the back of a semiconductor laser diode element is formed, the master oscillator oscillating in a single longitudinal mode, a first optical isolator which prevents light from returning to the master oscillator, a tapered semiconductor light amplifier, and a second optical isolator which prevents light from returning to the semiconductor light amplifier, the prior art wavelength converter generating a stable optical output (for example, refer to patent reference 2).

In addition, there has been disclosed a prior art wavelength converter including a resonator in which a diffraction grating is placed in the front of a semiconductor laser diode element, a master oscillator which oscillates in an injection locking mode by RF-modulating the above-mentioned semiconductor laser diode element, and a tapered semiconductor light amplifier which is a stage located behind the master oscillator, the prior art wavelength converter emitting light having a pulse-shaped waveform (for example, refer to patent reference 3).

Furthermore, there have been disclosed some prior art wavelength converters in which a gain medium in which the reflectivity of a front surface of a semiconductor laser diode is reduced is formed, an external resonator is constructed of a Bragg diffraction grating (referred to as an optical fiber grating from here on) formed in an optical fiber and the semiconductor laser diode element, and the semiconductor laser diode element is made to oscillate in a single longitudinal mode. In addition, there has been disclosed a structure in which light emitted out of such a prior art wavelength converter is optically coupled to a wavelength changing element. Furthermore, there has been disclosed a structure in which the single transverse mode of a semiconductor laser diode is maintained by using a polarization-maintaining optical fiber (for example, refer to patent reference 4).

[Patent reference 1] U.S. Pat. No. 5,321,718 (see the 6th to 12th columns, and FIGS. 5, 7 to 8, and 10)
[Patent reference 2] U.S. Pat. No. 5,745,284 (see the 3rd to 8th columns and FIG. 1)
[Patent reference 3] U.S. Pat. No. 5,561,676 (see the 3rd to 5th columns and FIGS. 1, and 7 to 10)
[Patent reference 4] Japanese patent application laid-open disclosure No. 11-509933,A (see pp. 2 to 12 and FIG. 1)

However, for example, IEEE Photonics Technology Letters (Vol. 10, No. 4, pp. 504-506, 1998) discloses that a monolithic integrated MOPA element as disclosed in above-mentioned patent reference 1 has a problem that its spectrum and optical output vary due to a slight amount of externally reflected light, and also discloses a method of solving the problem. Especially, in a case in which such a monolithic integrated MOPA element is applied to a wavelength changing element, because remaining of slight variations in the spectrum causes a variation in the phase matching with the wavelength changing element and this results in a variation in the wavelength conversion efficiency of the wavelength changing element, it is necessary to insert an optical isolator into the output of the MOPA element so as to remove the externally reflected light. Another problem is however that such an optical isolator which is so designed as not to get optically damaged even if it accepts a fundamental wave of the order of watts is very expensive.

A wavelength converter as disclosed in, for example, patent reference 2, has an advantage of being able to use a cheap and general optical isolator because light having a small power from a master oscillator is simply inputted to the optical isolator. However, a problem with semiconductor light amplifiers is that, as disclosed in, for example, Photonics Technology Letters, Vol. 7, No. 5, and pp. 470-472, a slight amount of return light from outside causes variations in the light distribution in a plane horizontal to the active layer, and therefore an expensive optical isolator which prevents return light is also needed at the outputs of the semiconductor light amplifiers.

In addition, in, for example, the wavelength converter disclosed in patent reference 3, because the resonator consists of a semiconductor laser diode element and a diffraction grating, and a proper high-frequency signal is applied to the semiconductor laser diode element so that it oscillates in an injection locking mode, while the wavelength converter has an advantage of eliminating the necessity to have an expensive optical isolator, a high-frequency generating circuit is needed, a time domain pulse optical output is generated, but no continuous wave is acquired.

Furthermore, the semiconductor laser diode element disposed in the wavelength converter shown in patent reference 4 has a width limit of about 4 micrometers in order to maintain the single transverse mode in the optical waveguide having the active layer therein. Therefore, while a measure of providing a window structure or the like so as to reduce the optical density is taken in order to prevent an optical damage to the emergence end surface of the semiconductor laser diode element, the optical output is quite small, the frequency of chance failures resulting from optical damage caused by defects which occur in the end surfaces and active layer of the semiconductor laser diode element increases when the optical output from the semiconductor laser diode element exceeds 1 W, and the life of the semiconductor laser diode element is shortened remarkably. In addition, in this conventional example, an antireflection film is formed on the front surface of the semiconductor laser diode element so that the semiconductor laser diode element serves as a gain medium, the resonator is constructed of a diffraction grating (referred to as an optical fiber grating from here on) disposed in the optical fiber, and the semiconductor laser diode element, and the semiconductor laser diode element is made to oscillate in the single longitudinal mode. Therefore, another problem is that the spectrum varies again if return light from outside the resonator is incident upon the resonator.

The present invention is made in order to solve the above-mentioned problems, and it is therefore an object of the present invention to a fundamental-wave light source which reduces variations in the optical output thereof and variations in the spectrum of the optical output which are caused by external reflection to a master oscillator thereof, and which reduces variations in the light distribution of a semiconductor light amplifier in a lateral direction which are caused by the external reflection, and a wavelength converter light source which can carry out wavelength changing efficiently using the wavelength changing element, and which can output a high-power continuous wave in a short wavelength range.

DISCLOSURE OF THE INVENTION

In accordance with the present invention, there is provided a fundamental-wave light source including: a semiconductor laser diode element; an optical waveguide element for maintaining a polarization of the semiconductor laser diode element; a reflection element disposed in the optical waveguide element, for returning a part of light to the semiconductor laser diode element; and a semiconductor light amplifier optically coupled to the optical waveguide element, in which the semiconductor laser diode element oscillates in a coherent collapse mode.

Therefore, the present invention offers an advantage of being able to provide a fundamental-wave light source which reduces variations in the optical output and variations in the spectrum of the optical output which are caused by external reflection to the master oscillator, and which also reduces variations in the light distribution of the semiconductor light amplifier in a lateral direction which are caused by the external reflection.

PREFERRED EMBODIMENTS OF THE INVENTION

Hereafter, in order to explain this invention in greater detail, the preferred embodiments of the present invention will be described with reference to the accompanying drawings.

Embodiment 1

Figure 1:
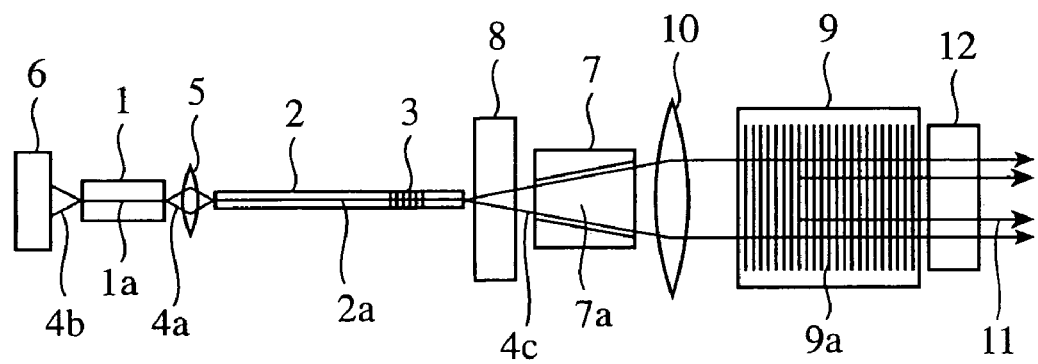
FIG. 1 is a block diagram of a wavelength converter in accordance with embodiment 1 of the present invention.

FIG. 1 is a diagram showing the structure of a wavelength converter in accordance with embodiment 1 of the present invention. In the figure, a semiconductor laser diode element 1 is a Fabry-Perot resonator type laser diode element having an active layer of single quantum well and a waveguide 1a. This semiconductor laser diode element 1 has a maximum of gain at a wavelength of 900 nm which is twice as high as that at a wavelength of 450 nm which is a blue wavelength, and a high reflection film of 90% of reflectivity which is formed on a rear face thereof and a low reflection film of 0.5% of reflectivity which is formed on a front face thereof in order to raise the light emission efficiency thereof. The semiconductor laser diode element 1 oscillates in many longitudinal modes independently. The waveguide 1a is constructed of an active layer, a light guide layer, and a clad layer laminated in a direction of its thickness, and oscillates in a single transverse mode.

In order to improve the reliability of the wavelength converter, it is necessary to reduce the current density and optical density of the waveguide 1a with respect to directions of surfaces of the waveguide 1a to relatively-low values, and therefore a ridge waveguide having a large width is typically used as the waveguide 1a. In this case, because the confinement of light in the waveguide is loose, the semiconductor laser diode exhibits characteristics in which while it is excited in a fundamental mode, i.e., in the single transverse mode when the amount of current injected thereto is small, it can be easily excited in a higher-order mode because of a spatial hole burning effect when the amount current injection becomes large and the optical density becomes high. In general, the polarization light extinction ratio is equal to or larger than its threshold and is close to 27 dB at an end of the semiconductor laser diode element from which the light is emitted.

A polarization-maintaining optical fiber is used as an optical waveguide element 2. Ultraviolet rays are applied to the core of the polarization-maintaining optical fiber via a phase mask so that a reflection element 3 which consists of a Bragg diffraction grating and has a wavelength selection nature is formed in the polarization-maintaining optical fiber. Because the polarization-maintaining optical fiber makes the propagation speeds both in an HE11 even-number mode and an HE11 odd-number mode, which are propagation modes, differ from each other so as to prevent the coupling between them, the polarization of linearly-polarized light inputted to the polarization-maintaining optical fiber can be maintained if the polarization of the linearly polarized light is directed along the slow axis or fast axis of the optical waveguide element 2. Because the equivalent refractive index of the optical waveguide 2a along the fast axis differs from that along the slow axis, the wavelength of the peak of light reflected by the reflection element 3 differs according to whether the polarization of the light is directed along the slow axis or fast axis of the optical waveguide element. In this case, the electric field of the incident light is directed along the slow axis of the optical waveguide element so that the optical waveguide is made to be resistant to the bending loss. Therefore, although the polarization light extinction ratio degrades due to the stress which occurs at the time when a lens 5 and the optical waveguide element 2 are fixed in the wavelength converter, the polarization light extinction ratio becomes equal to or larger than 20 dB at an end of the optical waveguide element from which the light is emitted.

Since the waveguide 1a is flat, the beam 4a emitted out of the semiconductor laser diode element 1 has a large aspect ratio. Therefore, in order that the beam 4a is optically coupled to the optical waveguide element 2 provided with the circular cross-section optical waveguide 2a with a low loss, the lens 5 is formed in the form of an asymmetrical optical system so that the aspect ratio of the beam is corrected. The gain band of the semiconductor laser diode element 1 has a wavelength dependency which slightly varies with variations in the wavelength because the semiconductor laser diode element has a single quantum well structure. Therefore, in a case in which the reflection peak wavelength of the reflection element 3 is set so that it falls within a range of wavelengths defined by this gain band, the semiconductor laser diode element has a maximum gain in the vicinity of the reflection peak wavelength and the oscillation wavelength of the semiconductor laser diode element 1 is controlled. It is known from a relation between an optical-length-based phase relation between the semiconductor laser diode element 1 and the reflection element 3 and the amount of light returned from the reflection element 3 to the semiconductor laser diode element 1 that the complex resonator can oscillate in various longitudinal modes including the single mode, multimode, and coherent collapse mode.

In this embodiment, in order to make the semiconductor laser diode element 1 oscillate in the coherent collapse mode which is resistant to return light from outside the semiconductor laser diode element 1, the reflectivities of the rear and front faces of the semiconductor laser diode element 1 are set to 90% and 0.5%, respectively, the length of the resonator is set to 1.8 mm, the reflectivity of the reflection element 3 is set to 3%, the reflection bandwidth of the reflection element 3 is set to 0.4 nm, the coupling efficiency of the lens 5 is set to 80%, and the line width of the light emitted out of the semiconductor laser diode element 1 is set to 0.3 nm. As explained in detail in Journal of Lightwave Technology Vol. LT-4, No. 11, and pp. 1655-1661, the coherent collapse mode is a state in which a relaxation oscillation occurs due to return light from the reflection element, and the light emitted out of the semiconductor laser diode element cannot be easily influenced by even the return light which comes from outside the semiconductor laser diode element.

As disclosed in, for example, JP,5-249519,A, by making the reflection peak wavelength of the reflection element 3 be longer than the cutoff wavelength of the semiconductor laser diode element 1, it is possible to prevent the semiconductor laser diode element from oscillating in higher-order transverse modes and it is also possible to make the semiconductor laser diode element oscillate in the single transverse mode with stability as long as the light emitted out of the semiconductor laser diode element has an optical output of up to 600 mW at the end of the fiber. An optical output 4b of the semiconductor laser diode element 1 is detected by a photo-diode 6 for monitoring which is placed at the back of the semiconductor laser diode element, and, on the basis of this monitored output, a control circuit not shown in the figure controls the forward current of the semiconductor laser diode element 1 so as to stabilize the beam 4a emitted out of the semiconductor laser diode element.

A tapered semiconductor light amplifier 7 has a mode field diameter of 250 µm in a direction horizontal to an incidence surface thereof, a mode field diameter of 500 µm in a direction horizontal to an emergence surface thereof, a flare angle of 6 degrees, and a chip length of 1.6 mm, and has a shape similar to that shown in IEEE PHOTONICS TECHNOLOGY LETTER, Vol. 5, No. 10, pp. 1179-1182. A current non-injection region is placed in the vicinity of end surfaces of the tapered semiconductor light amplifier, and antireflection films are further formed on the end surfaces. Because the light beam emitted out of the optical waveguide 2a of the optical waveguide element 2 has a circular shape in cross section, the beam shape is converted into an oblong beam shape in cross section by a cylindrical lens 8 so that the mode matching loss is reduced, and the light beam is optically coupled to a waveguide 7a of the semiconductor light amplifier 7.

Although it is preferable that in order to saturate the gain of the active layer of the semiconductor light amplifier 7, the optical density of the semiconductor light amplifier at the incidence end of the active layer in a lateral direction of the active layer is about 1 mW/µm, the light emitted out of the semiconductor laser diode element has a sufficient power at the end of the optical fiber regardless of the loss caused by the coupling system. In a case in which the incident light 4c has a power of about 300 mW and the forward current of the semiconductor light amplifier is 7 A, the semiconductor light amplifier outputs an optical output 4d of about 5 W. In general, antireflection films are formed on the end surfaces of the semiconductor light amplifier 7 and the semiconductor light amplifier 7 carries out traveling-wave amplification of the light beam incident thereupon. Therefore, in a case in which a measure of preventing the lens effect from occurring in the semiconductor light amplifier due to carrier and heat is installed and operating conditions are suitably selected, the semiconductor light amplifier can amplify the light beam incident thereupon while maintaining the quality of the beam which is close to that of diffraction-limited light. While the amplification factor of the semiconductor light amplifier is typically set to 10 times to 100 times, the amount of the incident light is adjusted in order to lower the electron density and the photon density in the waveguide 7a so as to reduce the occurrence of spatial hole burning.

In this case, the linearly polarized light from the optical waveguide element 2 is incident upon the active layer of the tapered semiconductor light amplifier 7 while the polarization of the linearly polarized light is directed in a direction horizontal to the active layer, and is then outputted from the active layer while its linear polarization is maintained. Because the light emitted in the coherent collapse mode from the semiconductor laser diode element 1 is incident upon the semiconductor light amplifier 7, the semiconductor light amplifier 7 amplifies the light while making it have a spectrum of low coherence so that the light is hard to receive influence by the return light from outside the semiconductor light amplifier. Therefore, the characteristics of the semiconductor light amplifier which usually and easily forms a filament-shaped oscillation mode because of the return light can be improved remarkably, and a high-power fundamental wave having a sufficient beam quality can be provided.

A wavelength changing element 9 is manufactured by applying an electric field to an X-cut substrate which is a nonlinear optical crystal, such as LiNbO$_3$ into which 5% or more of MgO is doped, so as to form a spontaneous periodic polarization reversing structure in which quasi phase matching is established between a fundamental wave and a second harmonic wave, and by thinning the substrate, and, after that, placing a clad layer and a support layer in which both the fundamental wave and second harmonic can propagate in the single mode on each of the upper and lower surfaces of the substrate. In this case, an X-cut substrate is used and the polarization direction of the semiconductor light amplifier 7 is made to match with the polarization direction of the wavelength changing element 9.

This wavelength changing element 9 does not have confinement of refractive indexes in directions horizontal to surfaces thereof, and has a slab waveguide structure 9a. This is because there is apprehension that an excess increase in the optical density of incident light causes optical damage due to the photorefractive effect to the wavelength changing element. The wavelength conversion efficiency of the wavelength changing element is further improved with increase in the optical density of incident light. Therefore, in an actual design, optimization is carried out in consideration of the reliability and wavelength conversion efficiency of the wavelength changing element. In this case, the wavelength changing element has a length of 10 mm, a fundamental-wave-spectrum line width of 0.3 nm, a peak light intensity of about 10 MW/cm$^2$, and a wavelength conversion efficiency of a little less than 50%.

Although not shown in the figure, because in the wavelength changing element 9, if the fundamental wave and higher harmonic waves return from the incidence end surface or emergence end surface, the conversion efficiency of the wavelength changing element drops remarkably. Therefore, both the end surfaces of the wavelength changing element are ground so that they are slanting or antireflection films are formed on the end surfaces of the wavelength changing element, so that the wavelength changing element can carry out wavelength changing with a single pass more efficiently. The waveguide of the wavelength changing element can be a ridge waveguide having a large width or a channel waveguide having a large width. When the length of the waveguide is as short as about 10 mm, the wavelength changing element can excite only desired low-order modes of the waveguide by adjusting the intensity distribution of the incident light. Because a second harmonic beam 11 emitted out of the wavelength changing element 9 is light which is diffused in a vertical direction, the beam is collimated by a cylindrical lens 12. Furthermore, except in a case in which the fundamental wave and higher harmonic waves are used in mixture, the fundamental wave which does not contribute to the wavelength changing is reflected and removed by a wavelength selection filter not shown.

Next, the temperature characteristic of the wavelength converter will be explained.

Figure 2:
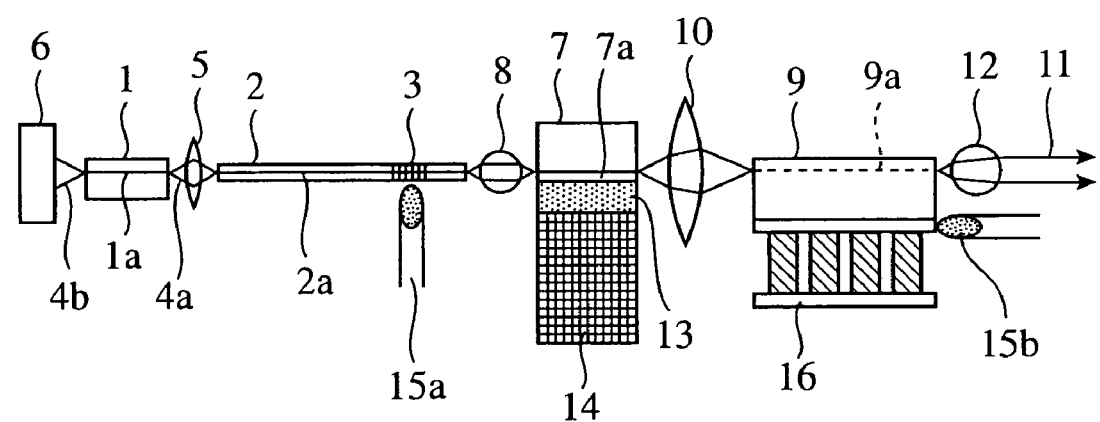
FIG. 2 is a vertical sectional view of the wavelength converter in accordance with embodiment 1 of the present invention.

FIG. 2 is a diagram showing a vertical section of the wavelength converter in accordance with embodiment 1 of the present invention.

The temperature characteristic of the reflection element 3 is a main factor of the wavelength-temperature characteristic of the fundamental wave of the semiconductor laser diode element 1, and the semiconductor laser diode element 1 has a wavelength temperature coefficient of 0.008 nm/degree Celsius. Although the gain peak of the semiconductor laser diode element 1 exhibits a wavelength-temperature characteristic of 0.4 nm/degree Celsius, the semiconductor laser diode element 1 can oscillate with stability when it is placed in an environment at a temperature range of about 0 degrees Celsius to 50 degrees Celsius which is generally requested by home appliances even if temperature control is not performed thereon, because the gain band is wide in the single quantum well.

The semiconductor light amplifier 7 produces a fundamental-wave output of 5 W and generates heat of about 6 W when a current of 7 A is applied thereto. Exhaustion of this heat is a very big problem. At the present time, the semiconductor light amplifier 7 is so constructed as to have a junction down structure. In this structure, after the heat is diffused by a heat sink 14 via a good-thermal-conductive aluminum nitride substrate 13, and the heat sink is air-cooled by radiating fins not shown in the figure. It is well known that the temperature characteristic of the wavelength conversion efficiency which results from the quasi phase matching conditions of the wavelength changing element 9 needs more-precise temperature control.

From the above-mentioned viewpoint, a first temperature detecting means 15a is disposed in the vicinity of the reflection element 3 in order to estimate variations in the wavelength of the fundamental wave, a second temperature detecting means 15b is disposed in the vicinity of the wavelength changing element 9 in order to carry out temperature control of the wavelength changing element, and a Peltier device 16 is adjusted using an external electronic circuit (not shown) so that the wavelength conversion efficiency of the wavelength changing element is stabilized. Thermistor elements are used as the temperature detecting means 15a and 15b.

In above-mentioned embodiment 1, no temperature control of the semiconductor laser diode element 1 and semiconductor light amplifier 7 is carried out for power-saving. As an alternative, temperature control of the semiconductor laser diode element and semiconductor light amplifier can be carried out.

In above-mentioned embodiment 1, the Peltier device 16 is used as the temperature control device of the wavelength changing element 9. As an alternative, a heater can be used as the temperature control device so that the wavelength changing element 9 can be made to operate at a high temperature. In this case, recovery of defects due to the photorefractive effect can be expected.

As mentioned above, in accordance with embodiment 1, there can be provided a fundamental-wave light source including a semiconductor laser diode element, an optical waveguide element for maintaining the polarization of the semiconductor laser diode element, a reflection element disposed in the optical waveguide element, for returning a part of light to the semiconductor laser diode element, and a semiconductor light amplifier optically coupled to the optical waveguide element, the semiconductor laser diode element oscillating in the coherent collapse mode. Therefore, in the fundamental-wave light source, variations in the optical output and variations in the spectrum of the light which are caused by external reflection to the master oscillator can be reduced and variations in the light distribution in the lateral direction of the semiconductor light amplifier which are caused by the external reflection can be also reduced.

Furthermore, in accordance with embodiment 1, because the semiconductor light amplifier has an active layer which widens horizontally along the traveling direction of incident light, there can be provided an advantage of being able to reduce the power of the light incident to the semiconductor light amplifier, and making it difficult for the filament phenomenon to occur.

In addition, in accordance with embodiment 1, because the optical waveguide element consists of a polarization-maintaining optical fiber, the linearly-polarized light from the semiconductor laser diode element can be guided to the light amplifier while the linear polarization of the light is maintained.

Furthermore, in accordance with embodiment 1, there can be provided a wavelength converter including a semiconductor laser diode element, an optical waveguide element for maintaining the polarization of the semiconductor laser diode element, a reflection element disposed in the optical waveguide element, for returning a part of light to the semiconductor laser diode element, a semiconductor light amplifier optically coupled to the optical waveguide element, a periodic polarization reversing structure for performing quasi phase matching on a fundamental wave from the semiconductor light amplifier, and a wavelength changing element having an optical waveguide which allows at least the fundamental wave from the semiconductor light amplifier to propagate therein, the semiconductor laser diode element oscillating in the coherent collapse mode. Therefore, the wavelength converter can output a high-power continuous wave in a short-wavelength range with stability.

Furthermore, because the wavelength changing element in accordance with embodiment 1 includes a periodic polarization reversing structure for performing quasi phase matching on the fundamental wave from the semiconductor light amplifier, and a slab waveguide, the wavelength changing element enables the optical density to be set to an optimal value. In case that the wavelength changing element has a single mode waveguide and a high power of several watts is incident upon the single mode waveguide, because degradation due to the photorefractive effect and so on occurs in the wavelength changing element, the optical density needs to be reduced. However, because the wavelength conversion efficiency of the wavelength changing element worsens when the optical density is reduced too much, it is necessary to make the optical density be an optimal value. In contrast, because the light is confined only in a uni-directional in the slab waveguide, the wavelength changing element exhibits a characteristic which is intermediate between that of a single mode waveguide and that of a bulk (i.e., without any waveguide), and enables the optical density to be set to an optimal value.

In addition, the wavelength converter in accordance with embodiment 1 includes at least one temperature detecting means and at least one temperature control means so that the temperature of the reflection element is detected and the temperature of the wavelength changing element is controlled. Therefore, the temperature control of the wavelength changing element can be carried out certainly, and, as a result, the wavelength converter can be made to exhibit desired characteristics.

Embodiment 2

Figure 3:
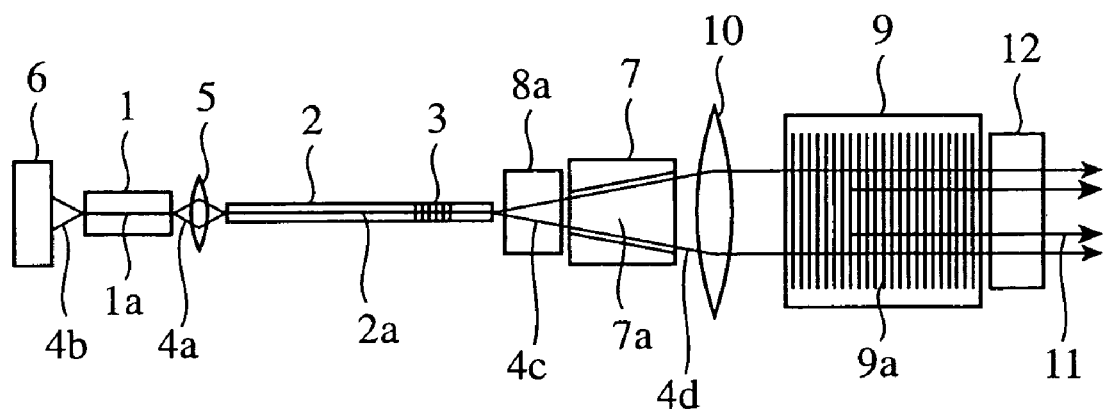
FIG. 3 is a block diagram of a wavelength converter in accordance with embodiment 2 of the present invention.

FIG. 3 is a block diagram of a wavelength converter in accordance with embodiment 2.

In above-mentioned embodiment, by optically coupling the optical waveguide element 2 to the semiconductor light amplifier 7 using the cylindrical lens 8, mode transformation is performed on light from the optical waveguide element. Instead of the cylindrical lens 8, a slab waveguide element 8a which consists of a silica waveguide as shown in FIG. 3 can be used. In FIG. 3, because the wavelength converter of this embodiment has the same structure as that of embodiment 1 shown in FIGS. 1 and 2 except for the slab waveguide element 8a, the same components are designated by the same reference numerals and the explanation of the components will be omitted hereafter.

The slab waveguide element 8a is so constructed as to have a relative index difference between the index of a core thereof and that of a clad thereof at an incidence end thereof which is much the same as that of the optical waveguide element 2, so that the slab waveguide element has much the same mode field diameter in the longitudinal direction thereof as the optical waveguide element, and a high coupling efficiency is provided. When the slab waveguide element is formed so that its cross section has a circular shape, the mode field diameter of the slab waveguide element at an emergence end thereof is made to match with that of the waveguide 7a of the semiconductor light amplifier 7. In contrast, the slab waveguide element 8a does not have a refractive-index waveguide structure with respect to a direction of its length, and widens in a space mode along the direction, and the mode field diameter of the slab waveguide element with respect to the direction of its length is made to match with that of the waveguide 7a of the semiconductor light amplifier 7.

As mentioned above, in accordance with embodiment 2, the optical coupling between the optical waveguide element and the semiconductor light amplifier is carried out using the slab waveguide element which consists of a silica waveguide. Therefore, the wavelength converter in accordance with the present embodiment offers the advantages as provided by the wavelength converter of embodiment 1 including the cylindrical lens.

Embodiment 3

Figure 4:
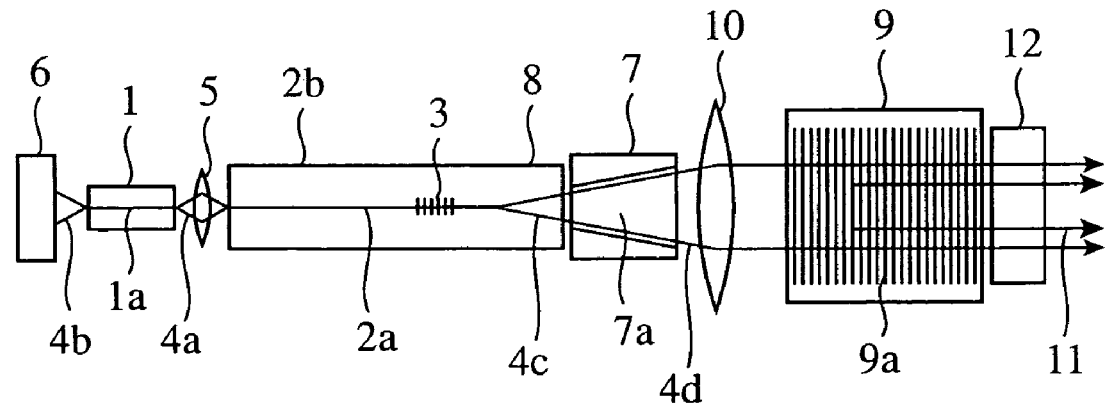
FIG. 4 is a block diagram of a wavelength converter in accordance with embodiment 3 of the present invention.

FIG. 4 is a block diagram of a wavelength converter in accordance with embodiment 3.

In above-mentioned embodiments 1 and 2, a polarization-maintaining optical fiber is used as the optical waveguide element 2. As an alternative, an optical waveguide element 2b which consists of quartz can be disposed, as shown in FIG. 4. In addition, the optical waveguide 2a of the optical waveguide element 2b is so constructed that no refractive-index waveguide structure is formed from the middle thereof, so that the light beam widens in a space mode along a direction of the length of the optical waveguide element, and the mode field diameter of the optical waveguide element with respect to the direction is made to match with that of the waveguide 7a of the semiconductor light amplifier 7. The wavelength converter in accordance with this embodiment has the same structure as that of embodiment 1 or 2 except for the above-mentioned component.

In above-mentioned embodiment, the optical waveguide 2a of the optical waveguide element 2b is shaped like a straight line. Needless to say that the optical waveguide can be downsized using repeatedly reflections or a curved waveguide, and this variant offers the same advantages.

As mentioned above, in accordance with embodiment 3, the wavelength converter includes an optical waveguide disposed in an optical waveguide element which consists of quartz. Therefore, the wavelength converter of this embodiment offers the same advantages as provided by the fundamental-wave light source and wavelength converter in accordance with embodiment 1.

Embodiment 4

Figure 5:
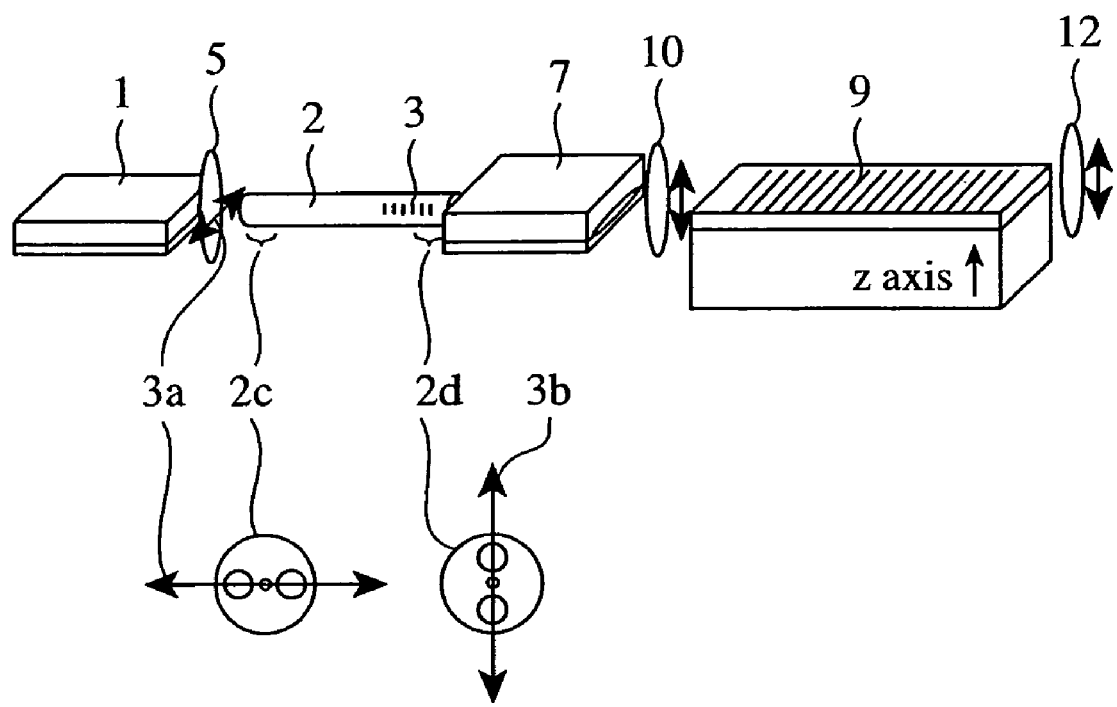
FIG. 5 is a block diagram of a wavelength converter in accordance with embodiment 4 of the present invention.

FIG. 5 is a block diagram of a wavelength converter in accordance with embodiment 4.

In above-mentioned embodiments 1 to 3, an example in which linearly polarized light from the optical guide element (or the polarization-maintaining optical fiber) 2 is incident upon the active layer of the tapered semiconductor light amplifier 7 so that its polarization is directed in a direction horizontal to the active layer, and the linearly polarized light is then made to emerge from the optical guide element while the polarization is maintained and is coupled to the waveguide of the X-cut wavelength changing element is shown. However, as can be seen from a method of manufacturing a periodic polarization reversing structure of an X-cut substrate disclosed in Applied Physics Letter Vol. 71 and pp. 3048-3050, wavelength changing elements tend to be difficult to form using an X-cut substrate.

Therefore, although it is easily considered to make use of a wavelength changing element formed of a Z-cut substrate in which a deep periodic polarization inversion layer can be formed, most of semiconductor laser diode elements are designed for a TE mode because semiconductor laser diode elements generally have high end surface reflectivity for the TE mode, strong confinement, a high gain for the TE mode, and a high gain in the quantum well usually for the TE mode. However, it is known that semiconductor light amplifiers can be made to have a high gain for a TM mode when tensile strain is applied to the quantum well.

In accordance with embodiment 4, an optical waveguide 2a is disposed so that a linearly polarized wave from a semiconductor laser diode element 1 can propagate in the optical waveguide, and so that a TM wave of an optical output from the optical waveguide 2a can be amplified by a semiconductor light amplifier 7. In FIG. 5, 2c and 2d denote an incidence end surface and an emergence end surface of the optical waveguide element 2, respectively, and 3a and 3b denote an electric field direction on the incidence end surface 2c and an electric field direction on the emergence end surface 2d, respectively. The TE (Transverse Electric) mode is a mode in which an electric field is directed in a direction horizontal to the active layer (i.e., a magnetic field is directed both in a direction perpendicular to the active layer and in the traveling direction of light). The TM (Transverse Magnetic) mode is a mode in which a magnetic field is directed in the direction horizontal to the active layer (i.e., an electric field is directed both in the direction perpendicular to the active layer and in the traveling direction of light). The TM wave is a polarized wave in the TM mode.

In accordance with this embodiment 4, the semiconductor light amplifier 7 only has to have a certain gain for the TM mode, and linearly polarized light from the optical guide element (or the polarization-maintaining optical fiber) 2 is incident upon the active layer of the tapered semiconductor light amplifier 7 so that its polarization is directed in the direction perpendicular to the active layer, and the linearly polarized light is then made to emerge from the optical guide element while the polarization is maintained and is coupled to the waveguide of a Z-cut wavelength changing element 9.

As mentioned above, in accordance with the present invention, the optical waveguide element is placed so that the linearly polarized wave of the semiconductor diode element can propagate in the optical waveguide element, and so that the semiconductor light amplifier can amplify the TM wave of the optical output from the optical waveguide element. Therefore, a Z-cut wavelength changing element can be used, and the wavelength converter can be easily manufactured.

In accordance with embodiment 4, because the substrate of the wavelength changing element is a Z-cut substrate, a periodic polarization inversion region having a large cross-section area (i.e., having a large width and a large depth) can be formed in the wavelength changing element.

INDUSTRIAL APPLICABILITY

As mentioned above, in accordance with the present invention, there is provided a high-power fundamental-wave light source provided with a master oscillator having little variation in the intensity and optical spectrum of light which it generates with respect to return light, and a semiconductor light amplifier having a light intensity distribution which can not be easily influenced by the return light when amplifying the light, and the fundamental-wave light source and a wavelength converter provided with the light source are suitable for being used as the light source of a laser printer, a laser display device, an optical memory device, or the like.

The invention claimed is:

1. A fundamental-wave light source comprising:
a semiconductor laser diode element;
an optical waveguide element for maintaining a polarization of said semiconductor laser diode element;
a reflection element disposed in said optical waveguide element, for returning a part of light to said semiconductor laser diode element; and
a tapered semiconductor light amplifier optically coupled to said optical waveguide element,
wherein said semiconductor laser diode element oscillates in a coherent collapse mode
and further wherein said waveguide element is disposed between said laser diode element and said tapered semiconductor light amplifier such that said amplifier amplifies linearly polarized, coherent collapse mode light in a spectrum of low coherence.

2. The fundamental-wave light source according to claim 1, wherein the optical waveguide element is placed so that it makes a linearly polarized wave from the semiconductor diode element propagate therethrough, and so that the semiconductor light amplifier amplifies a TM wave of an optical output from said optical waveguide element, and further wherein the semiconductor light amplifier has a mode field diameter of 250 µm along an incidence surface, a mode field diameter of 500 µm along an emergence surface, and a flare angle of 6 degrees.

3. The fundamental-wave light source according to claim 1, wherein the semiconductor light amplifier has an active layer which widens horizontally along a traveling direction of the light.

4. The fundamental-wave light source according to claim 1, wherein the optical waveguide element consists of a polarization-maintaining optical fiber.

5. A wavelength converter comprising:
a semiconductor laser diode element;
an optical waveguide element for maintaining a polarization of said semiconductor laser diode element;
a reflection element disposed in said optical waveguide element, for returning a part of light to said semiconductor laser diode element;
a tapered semiconductor light amplifier optically coupled to said optical waveguide element such that said waveguide element is disposed between said laser diode and said tapered amplifier and said amplifier amplifies linearly polarized, coherent collapse mode light in a spectrum of low coherence;
a periodic polarization reversing structure for performing quasi phase matching on a fundamental wave from said semiconductor light amplifier; and a wavelength changing element having a slave optical waveguide which allows at least the fundamental wave from said semiconductor light amplifier to propagate therein, wherein said semiconductor laser diode element oscillates in a coherent collapse mode and further wherein the wavelength changing element includes anti-reflection films disposed on the ends thereof.

6. The wavelength converter according to claim 5, wherein said wavelength converter includes a wavelength changing element having both a periodic polarization reversing structure for performing quasi phase matching on the fundamental wave from said semiconductor light amplifier and a slab waveguide.

7. The wavelength converter according to claim 6, wherein said wavelength changing element has a Z-cut substrate.

8. The wavelength converter according to claim 6, wherein said wavelength converter includes at least a temperature detecting means and at least a temperature control means, and wherein a temperature of the reflection element is detected and a temperature of the wavelength changing element is controlled.

9. The fundamental-wave light source of claim 1, wherein the laser diode element is a Fabry-Perot resonator type laser diode element with a maximum gain at a wavelength of 900 nm.

10. The fundamental-wave light source of claim 1, wherein the laser diode element has a high reflection film disposed on a rear face and a low reflection film disposed on a front face, where the high reflection film has a reflectivity of 90% or higher, and the low reflection film has a reflectivity of 0.5% or lower.

11. The fundamental-wave light source of claim 1, wherein the reflectivity of the reflection element is 3% and further wherein the reflection bandwidth of the reflection element is 0.4 nm.

12. The fundamental-wave light source of claim 1, wherein the light emitted from the optical waveguide element is linearly polarized in a direction horizontal to the active layer of the semiconductor light amplifier.

13. The fundamental-wave light source of claim 12, wherein the semiconductor light amplifier amplifies the light while maintaining its polarization and making it have a spectrum of low coherence, thereby reducing feedback interference.

14. The wavelength converter of claim 5, wherein the wavelength changing element comprises $LiNbO_3$ doped with at least 5% of MgO.

15. The wavelength converter of claim 5, wherein the wavelength changing element has a wavelength conversion efficiency of a little less than 50%.

* * * * *